United States Patent [19]

Hynes et al.

[11] 4,320,412
[45] Mar. 16, 1982

[54] COMPOSITE MATERIAL FOR MOUNTING ELECTRONIC DEVICES

[75] Inventors: Roger P. Hynes, Union County, N.J.; Karl A. Stackhouse, Northampton County, Pa.

[73] Assignee: Western Electric Co., Inc., New York, N.Y.

[21] Appl. No.: 116,418

[22] Filed: Jan. 29, 1980

Related U.S. Application Data

[63] Continuation of Ser. No. 809,211, Jun. 23, 1977, abandoned.

[51] Int. Cl.³ .................. H01L 23/48; H01L 29/44; H01L 29/52
[52] U.S. Cl. ........................... 357/70; 357/65; 357/67; 357/71; 357/81; 428/594; 428/620; 428/629
[58] Field of Search ............... 357/67, 65, 71, 81, 357/70; 428/594, 614, 620, 929

[56] References Cited

U.S. PATENT DOCUMENTS

| | | | |
|---|---|---|---|
| 2,796,563 | 6/1957 | Ebers et al. | 357/81 |
| 2,964,830 | 12/1960 | Henkel et al. | 357/81 |
| 3,143,684 | 8/1964 | Miller | 357/81 |
| 3,296,501 | 1/1967 | Moore | 357/81 |
| 3,334,279 | 8/1967 | Lueck | 357/81 |
| 3,351,700 | 11/1967 | Savolainen | 357/81 |
| 3,399,332 | 8/1968 | Savolainen | 357/67 |
| 3,969,754 | 7/1976 | Kuniya et al. | 357/81 |
| 4,025,997 | 5/1977 | Gernitis et al. | 357/81 |
| 4,283,464 | 8/1981 | Hascoe | 357/81 |

FOREIGN PATENT DOCUMENTS 50-36750 11/1975 Japan ..................... 357/81

OTHER PUBLICATIONS

Inlax Clad Metals; Electronic Design 3 Feb. 1, 1977, p. 11.
Laser Heat Sink; by Johnson, vol. 7 No. 9, Feb. 1965; IBM Technical Bulletin.

*Primary Examiner*—Andrew J. James
*Attorney, Agent, or Firm*—G. W. Houseweart

[57] ABSTRACT

A lead frame for mounting semiconductor chips includes laminated chip-mounting portions. These portions are comprised of a high thermal conductivity lead-frame material laminated with upper and lower surfaces of a material which matches the expansivity of the semiconductor. These upper and lower surfaces prevent warping of the mounting portions and this, coupled with the matching of the expansivity of the chip, greatly reduces the likelihood of chip damage.

2 Claims, 5 Drawing Figures

COMPOSITE MATERIAL FOR MOUNTING ELECTRONIC DEVICES

The is a continuation, of application Ser. No. 809,211 filed June 23, 1977, now abandoned.

BACKGROUND OF THE INVENTION

1. Field of the Invention

This invention relates to a composite material for mounting fragile articles and, more particularly, a composite lead frame material on which semiconductor chips may be mounted with minimum thermal stress.

2. Description of the Prior Art

Medium and higher power semiconductor devices, such as transistors, must dissipate substantial amounts of energy. The package for each transistor must have low thermal resistance and not stress the semiconductor chip therein.

Copper meets the low thermal resistance, i.e., high thermal conductivity requirement, and so would be a good material on which to mount the chip. Unfortunately, its coefficient of thermal expansion is much greater than that of the semiconductor material, e.g., silicon, of the chip. Therefore, a chip mounted thereon will break or malfunction due to thermally induced stresses.

Iron-nickel-cobalt alloys have a thermal expansion coefficient close to silicon and induce much less stress. But these alloys have about 1/25th the conductivity of copper and cannot conduct the heat away. With no ability to carry the heat away, a semiconductor chip would soon overheat.

One solution has been to combine the two materials by inlaying iron-nickel-cobalt alloy in the copper and mounting the semiconductor chip on the iron-nickel-cobalt.

Another solution, as in the case of a gallium-arsenide laser diode, is to mount the diode on silver inlaid in a molybdenum base sufficiently heavy and strong to constrain the expansion of the silver.

But these bimetallic materials inherently bow or warp like any bimetallic materials in which the two metals have different coefficients of expansion. This bowing or warping will bend any article, such as a semiconductor chip, bonded to the bimetallic material.

Semiconductor chips are extremely brittle and bend very little before breaking. They become highly stressed causing characterization shifts and/or cracking and, therefore, will malfunction. As a result bending stresses must be minimized or avoided.

Some manufacturing processes require heat for bonding the semiconductor chip in place and heat is generated by operation of the device. For either or both reasons the bimetal strip warps and may stress or break the semiconductor chip.

SUMMARY

Accordingly, it is an object of the invention to provide a composite mounting material, for a fragile article, which will not break or severely stress the article. This and other objectives are accomplished by providing a composite material which includes a metal strip of high thermal conductivity inlaid on both sides with a material having a coefficient of expansion compatible with or matching that of the article. A particularly suitable combination for silicon semiconductor work is copper inlaid with an iron-nickel-cobalt alloy. This is made into lead frames in which the top and bottom surfaces of the semiconductor chip mounting portion are both iron-nickel-cobalt alloy. The forces of thermal expansion which act to warp the mounting portion balance each other so that the mounting portions do not warp, crack or severely stress the chips.

BRIEF DESCRIPTION OF THE DRAWINGS

Other objects, advantages and features of the invention will be more readily understood from the following description of specific embodiments thereof, when read in conjunction with the accompanying drawings in which.

DETAILED DESCRIPTION

Figure 1:
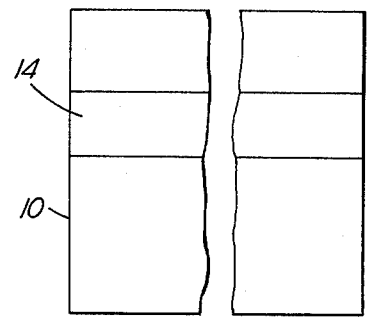
FIG. 1 is a plan view of a composite lead-frame material.

Referring now to FIG. 1, there is shown a thin strip of thermally conductive material, e.g., copper 10. Typically the thickness of the strip may be approximately 0.020 inches and the width about 1¼ inches while the length is any suitable one. It is, of course, to be understood that these and other dimensions referred to herein vary with the particular transistor to be fabricated using such strip.

A material like copper having good thermal conductivity, about 0.92 cal/sec/cm$^2$/°C./cm, also has a relatively high thermal coefficient of linear expansion, about $16.42 \times 10^{-6}$ cm/cm/°C. Semiconductor materials, such as silicon, have much lower thermal coefficients of conductivity and expansion, about 0.2 cal/sec/cm$^2$/°C./cm and $7.5 \times 10^{-6}$ cm/cm/°C.

The expansion of the copper 10 is incompatible with that of the silicon which is fragile, i.e., brittle and easily broken or damaged. Therefore, silicon material, such as a semiconductor chip 12, refer to FIGS. 4 and 5, should not be fixed directly on the copper 10.

A second material 14, having expansion characteristics which match and are compatible with those of the silicon chip 12, and having the strength to withstand the expansion of the copper 10, must be interposed between the chip and the copper. One such material 14 is the alloy by which, of 29% nickel, 17.5% cobalt and the remainder iron, sold by Carpenter Technology Corporation under the trademark Kovar.

Figure 2:
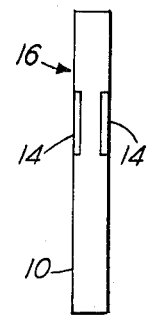
FIG. 2 is an end view of the composite material of FIG. 1 in which the thickness is exaggerated and one material is inlaid in the other.
Figure 3:
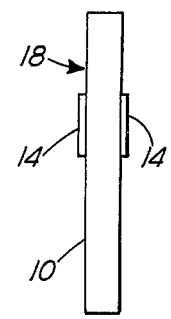
FIG. 3 is an end view of an alternative composite material of FIG. 1 in which the thickness is exaggerated and which one material is bonded to the surface of the other.

The material 14, typically about 0.150 inches wide and 0.0025 inches thick, may be inlaid in one side of the copper 10, refer to FIG. 2, or appliqued on the surface on one side, refer to FIG. 3, by methods well known in the laminated metal arts. However, the resulting bimetallic strip deforms or bows when heated. The amount of the bowing will depend on the temperature to which the strip is heated. A relatively small temperature change will bow the strip enough to severely stress one of the chips 12 mounted thereon and cause it to malfunction. A larger temperature change will break the chip.

The bowing of the bimetal strip may be prevented by inlaying or appliqueing another strip of material 14 of the same width and thickness on the back side of the copper 10 directly opposite the first strip of material 14. This forms an inlaid composite material 16 as shown in FIG. 2 or appliqued composite material 18 as shown in FIG. 3. Thus, the strips of material 14 neutralize each other, insofar as bending or bowing of the copper 10 is concerned. And the composite material 16 or 18 provides a structure highly suitable for semiconductor device manufacture as will be described.

Figure 4:
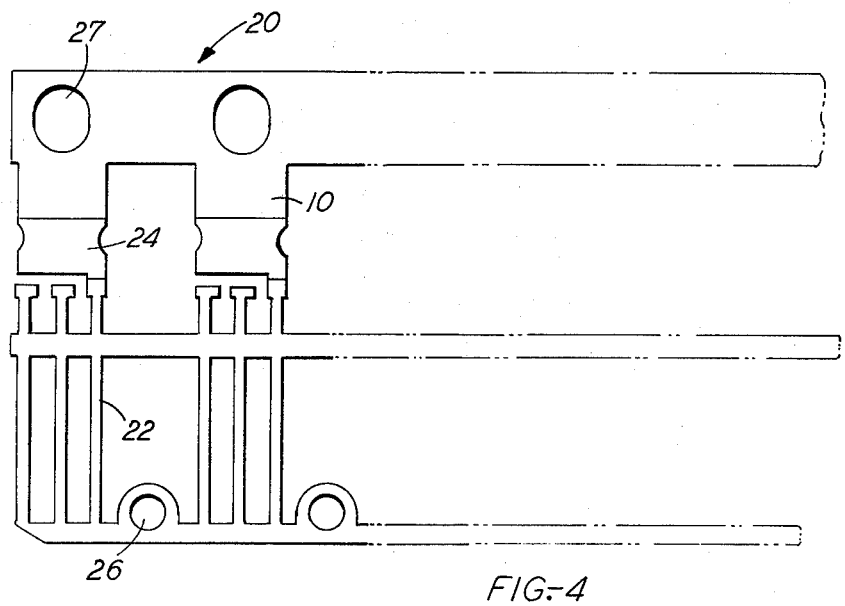
FIG. 4 is a plan view of a lead frame, formed from the material of FIG. 1, having a semiconductor chip mounted at the righthand end.
Figure 5:
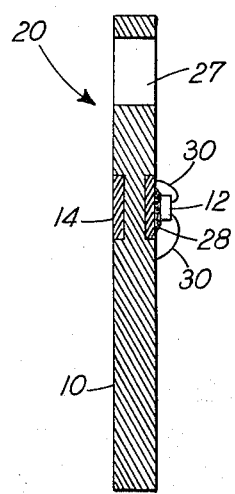
FIG. 5 is an enlarged cross section through the righthand end of the lead frame of FIG. 4.

Referring now to FIG. 4, the composite material 16, is formed into a lead frame 20 by means of an appropriate punch and die and stamping methods well known in the metal working arts. The lead frame 20 includes: leads 22; platforms or chip-mounting portions 24 which extend from one lead 22 in each group of three leads 22; and supporting structure which connects leads 22 and mounting portions 24 together in groups comprising three leads 22 and one mounting portion 24. Apertures 26 and 27 facilitate manufacturing operations and subsequent use of the semiconductor devices which may employ the lead frame 20. The supporting structure is removed after encapsulation.

The second material 14, e.g., Kovar, is applied to the copper 10 in the region where the mounting portion 24 will be formed. Thus, the top and bottom surfaces of mounting portion 24 will be comprised of the Kovar.

A semiconductor chip 12, in this case a transistor chip, is shown mounted on the portion 24 at the righthand end of the lead frame 20 for illustrative purposes. It is to be noted that, although at the lefthand end of the lead frame 20 the portion 24 extends from the righthand lead 22 of each group of leads, at the righthand end of the lead frame 20 the portion 24 extends from the center lead of the group. This is done simply to illustrate that the portion 24 may extend from any lead 22.

The chip 12 may be mounted on the portion 24 by means well known in the semiconductor art which include soldering, gold bonding and epoxy bonding. A transistor chip 12 is shown mounted on the righthand end of the lead frame 20, refer to FIG. 4 and the cross section FIG. 5, by means of epoxy 28. The epoxy may be that sold by Ablestik Adhesive Co., Gardena, Cal. under the trademark Ablebond #36-2. This is a silver filled, thermally and electrically conductive, epoxy designed for semiconductor chip bonding.

When the chip 12 is epoxy bonded, as in this case, an electrical wire connection should be made from the base, emitter, and collector of each transistor chip 12 to its respective leads 22 and mounting portion 24.

This may be done with commercially available wire bonders which bond wires 30 to bonding pads on the chip and appropriate points on the leads and mounting portion.

Finally, a plastic encapsulation not shown is formed around this mounting portion 24 to enclose the chip 24, the wires 30 and a small adjacent portion of the leads 22. Then, all metal is trimmed away except the leads 22 and a tab which extends from the finished transistor and contains the aperture 27 for fastening the transistor to a heat sink or the like.

While there has been described herein practical embodiments of the present invention, it is to be understood that various modifications and refinements which deviate from the enclosed embodiment may be adopted without departing from the spirit and scope of the present invention.

What is claimed is:

1. A lead frame for mounting a semiconductor chip which comprises:
    (a) a strip of copper material;
    (b) first and second strips of compatible material comprised of an alloy of principally iron, nickel and cobalt in proportions by weight of about 53.5%, 29%, and 17.5% respectively, said first and second strips inlaid on opposite sides of a portion constituting less than all of said copper material such that said first and second strips of compatible material are parallel and opposite each other and said first strip of compatible material having a chip mounting portion therein; and
    (c) said first and second strip of compatible material being substantially equal in thickness and together being less than thirty percent and greater than fifteen percent of the thickness of the lead frame.

2. A lead frame as set forth in claim 1 wherein said first and second strips of compatible material are approximately 0.0025 inches thick and the overall thickness of the lead frame is approximately 0.02 inches.

* * * * *

UNITED STATES PATENT AND TRADEMARK OFFICE
CERTIFICATE OF CORRECTION

PATENT NO. : 4,320,412
DATED : March 16, 1982
INVENTOR(S) : Roger P. Hynes and Karl A. Stackhouse It is certified that error appears in the above—identified patent and that said Letters Patent is hereby corrected as shown below:

In the title page Item [73] Assignee: should read

-- Western Electric Company, Incorporated and Bell Telephone Laboratories, Incorporated --.

Column 2, line 56, "which: should read --weight--.

Signed and Sealed this

Thirtieth Day of November 1982

[SEAL]

Attest:

GERALD J. MOSSINGHOFF

Attesting Officer

Commissioner of Patents and Trademarks